United States Patent [19]

Lewallen et al.

[11] Patent Number: 4,742,493
[45] Date of Patent: May 3, 1988

[54] MULTIPLE PORT MEMORY ARRAY DEVICE INCLUDING IMPROVED TIMING AND ASSOCIATED METHOD

[75] Inventors: Kent D. Lewallen, Cupertino; Moon-Seng Kok, Milpitas; Steve Schumann, Santa Clara; Woei-Jian Liu, Milpitas, all of Calif.

[73] Assignee: Advanced Micro Devices, Inc., Sunnyvale, Calif.

[21] Appl. No.: 864,690

[22] Filed: May 19, 1986

[51] Int. Cl.$^4$ .................................................. G11C 8/00
[52] U.S. Cl. ....................................................... 365/230
[58] Field of Search .......................... 365/49, 189, 230

[56] References Cited

U.S. PATENT DOCUMENTS

| | | | |
|---|---|---|---|
| 4,580,245 | 4/1986 | Ziegler et al. | 365/190 |
| 4,627,030 | 12/1986 | Barber | 365/230 |
| 4,636,991 | 1/1987 | Flannagan et al. | 365/230 |

*Primary Examiner*—James W. Moffitt
*Attorney, Agent, or Firm*—Patrick T. King; Stephen C. Durant; Eugene H. Valet

[57] ABSTRACT

An integrated circuit device which includes a memory array comprising a plurality of respective memory locations for storing binary data, each respective memory location corresponding to a respective combination of binary address signals, the device further comprising: at least two respective ports for receiving respective combinations of binary address signals corresponding to respective locations of said memory array; transition detection and signal providing circuitry for detecting a change in a respective binary address signal combination received by either a first or second of the at least two ports and for providing a first transition signal in response to a change in a respective first combination of binary address signals received by the first port and for providing a second respective transition signal in response to a change in a respective second combination of binary address signals received by the second port; and contention detection and signal providing means for receiving the first and the second transition signals and for detecting a match in the first and second combinations of binary address signals and for providing a respective first status signal in an inactive state in response to the first transition signal and for providing a respective second status signal in an inactive state in response to the second transition signal.

10 Claims, 5 Drawing Sheets

MULTIPLE PORT MEMORY ARRAY DEVICE INCLUDING IMPROVED TIMING AND ASSOCIATED METHOD

BACKGROUND OF THE INVENTION

1. Field of the Invention

The present invention relates generally to integrated circuit memory devices comprising an array of memory locations and further comprising multiple ports for receiving multiple combinations of binary address signals to simultaneously address multiple locations of the array and more particularly to integrated circuit memory devices including means for controlling a simultaneous provision of a combination of binary address signals to more than one port.

2. Description of the Related Art

There is a trend in computer technology today toward the use of multi-processors which increase the speed and throughput of computational tasks by distributing such tasks between more than one processing unit. An important aspect of typical multi-processor systems is the sharing of memory space by multiple processing units of the system. One earlier system, for example, provided access to shared memory space on a serial basis such that only one processing unit could access the space at any given time. More recently, however, dual-port memory devices have been developed which permit less restricted access to shared memory space by more than one processing unit.

Referring to the illustrative block diagram of FIG. 1, for example, there is shown a multiprocessor system 18 comprising a dual port memory device 20 and two respective microprocessors 22 and 24. The memory device 20 includes a left port for receiving left port binary address signals at terminals labelled A0L-A9L and left port binary input/output data signals at terminals labelled D0L-D7L. It also includes a right port for receiving right port binary address signals at terminals labelled A0R-A9R and right port binary input/output data signals labelled D0R-D7R. The left port receives address and data signals from the first microprocessor 22, and the right port receives address and data signals from the second microprocessor 24. The memory array 20 further includes respective left and right status signal terminals labelled respectively $\overline{BUSYL}$ and $\overline{BUSYR}$ which are discussed further below.

Typical earlier memory arrays of the general type illustrated in FIG. 1 included contention logic circuitry (not shown) used to arbitrate access to a respective memory location when more than one microprocessor simultaneously sought access to that location. For example, the contention logic circuitry often compared the combinations of address signals provided to the respective left and right address terminals A0L-A9L and A0R-A9R in order to determine whether there was a simultaneous attempt to access a single memory location of the memory array 20. In the event that simultaneous access was sought, the contention logic circuitry would determine which of the microprocessors 22 or 24 seeking to access the memory location would be provided first access to the location. The circuitry then provided, on a respective left or right status signal terminal, an active status signal, to a microprocessor whose access was to be delayed. A microprocessor granted first access then proceeded with its task; while a microprocessor whose access was delayed, for example, awaited access.

While these earlier multiple port integrated circuit memory array devices generally have been acceptable, there have been shortcomings with their use. More specifically, situations often arise in which an active status signal is prematurely provided to a microprocessor such that its access to a memory location is delayed even though there actually is no need for such a delay. For example, with regard to the system 18 of FIG. 1, the first microprocessor 22 might momentarily provide to the left port address terminals A0L-A9L a combination of binary address signals corresponding to a first location and then provide a combination of address signals corresponding to a second location. Simultaneously with the provision of address signals to the left address terminals which correspond to the first location, the second microprocessor 24 might provide to the right port address terminals A0R-A09 a combination of binary address signals which correspond to a third location, and then after a short period of time may provide a combination of address signals which correspond to the first location (where the first, second and third locations are distinct). Although there may be no period of time when both the first and second microprocessors 22 and 24 simultaneously provide combinations of address signals corresponding to the first location, an active status signal erroneously may be provided to either one or the other of the microprocessors 22 or 24 and incorrectly indicate a temporary match in address signal combinations.

Furthermore, problems may arise due to very brief matches in address signal combinations provided to the respective right and left address terminals as a result of address signal skew. Address signal skew can result when signals comprising a combination of signals provided to the left port, for example, change logical states at slightly different points in time. For example, in changing from a combination of address signals corresponding to one location to a combination corresponding to another location, it may be necessary to change the logical states of both the signals provided to terminal A0R and to terminal A9R. However, the signal provided to A0R, for example, might not change its logical state until five nanoseconds after the signal provided to A9R has changed its logical state. The five nanosecond delay would represent address signal skew which sometimes can result in a temporary match in combinations of address signals provided to the respective left and right ports, and consequently, may result in the provision of an active status signal which unnecessarily can delay access to the memory array 20 by one of the microprocessors 22 or 24.

Therefore, there has been a need for an integrated circuit device including a multiple port memory array which is more tolerant to near matches and to very brief temporary matches in combinations of binary address signals provided to more than one port such that access to the memory array by a microprocessor is not unnecessarily delayed. The present invention meets this need.

SUMMARY OF THE INVENTION

The present invention provides an integrated circuit device including a memory array comprising a plurality of respective memory locations for storing binary data. Each respective location of the array can be addressed by providing a combination of binary address signals which corresponds to the addressed location. The device includes at least two ports for receiving combinations of binary address signals. Transition detection and signal providing circuitry are included for detecting a change in a respective binary address signal combination received by either a first or second of the at least two ports. The transition detection and signal providing circuitry provides a first transition signal in response to a change in a respective first combination of binary address signals received by the first port and provides a second respective transition signal in response to a change in a respective second combination of binary address signals received by said second port. Furthermore, contention detection and signal providing circuitry is included for receiving the first and second transition signals and for detecting a match in the first and second combinations of binary address signals. The contention detection and signal providing circuitry provides a respective first status signal in an inactive state in response to the first transition signal and provides a respective second status signal in an inactive state in response to the second transition signal.

The present invention also provides a method for controlling access to respective ports of a multiple port integrated circuit memory array including a plurality of respective memory locations, each memory location corresponding to a respective combination of binary address signals. The method includes the step of receiving a first combination of binary address signals and a second combination of binary address signals. It further includes the steps of detecting a change in the first combination and of detecting a change in the second combination. A first transition signal is provided in response to a change in the first combination, and a second transition signal is provided in response to a change in the second combination. The method further includes the step of determining whether there is a match in the first and second combinations of binary address signals and providing a match signal in response to a match. Substantially during a first period of time, a first status signal is provided in an inactive state in response to the first transition signal, and substantially during a second period of time, a second status signal is provided in an inactive state in response to the second transition signal.

Therefore, the present invention advantageously provides a device and an associated method which are more tolerant to near matches and to very brief temporary matches of address signal combinations provided to different ports of a multiple port memory array without providing a status signal which unnecessarily delays access to the array.

These and other features and advantages of the present invention will become more apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENT

The present invention comprises a novel integrated circuit device and an associated method. The device includes a memory array comprising a plurality of respective memory locations for storing binary data, each respective memory location corresponding to a respective combination of binary address signals. The following description is presented to enable any person skilled in the art to make and use the invention, and is provided in the context of a particular application and its requirements. Various modifications to the preferred embodiment will be readily apparent to those skilled in the art and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
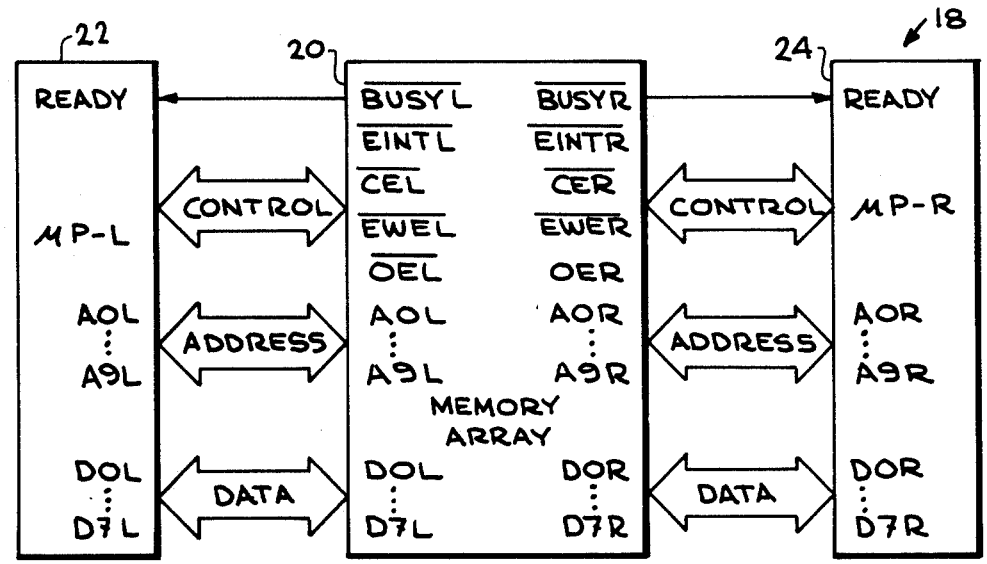
FIG. 1 shows a block diagram of an earlier multiprocessor system including a dual port memory array.
Figure 2:
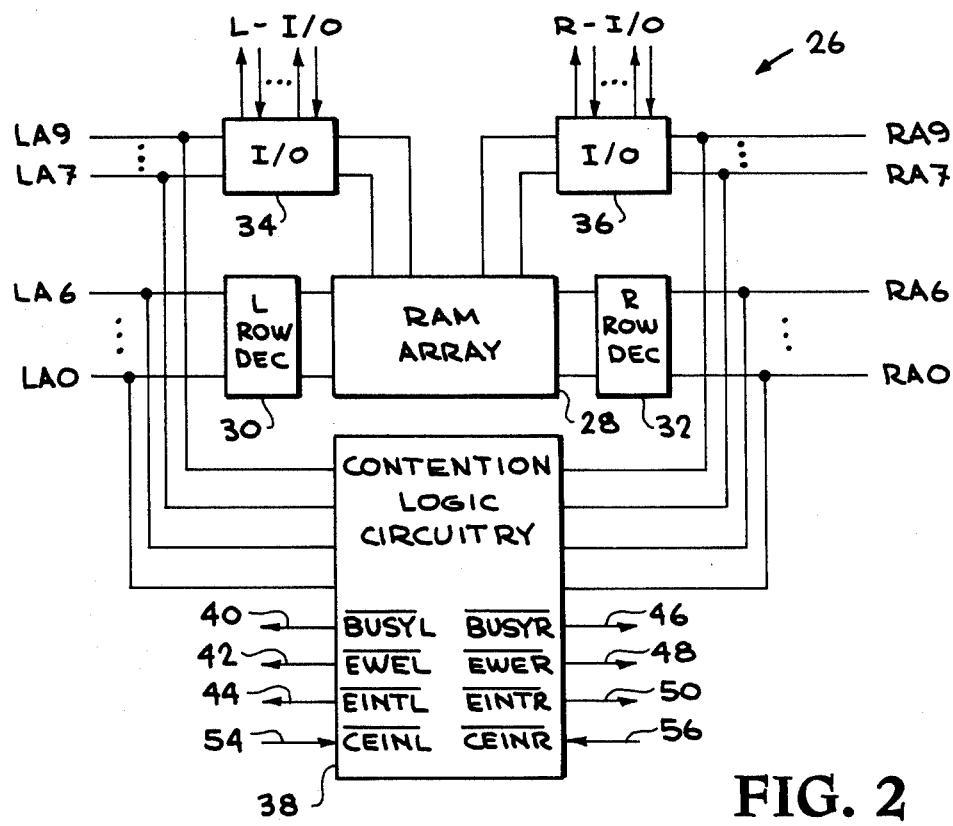
FIG. 2 shows a block diagram of a dual port random access memory of a preferred embodiment of the present invention.

Referring to the illustrative drawings of FIG. 2, a block diagram is shown of a dual port static random-access memory 26 in accordance with the present invention. The memory 26 includes a dual port 1024×8 random-access memory array 28 including respective left and right row decoder drivers 30 and 32 and respective left and right column decoder and input/output circuits 34 and 36. The memory 26 also includes integrated contention logic circuitry 38 coupled as shown. Although the preferred embodiment described herein includes a 1024×8 array, arrays of other sizes can be used as well. Furthermore, although the preferred embodiment includes a static random access memory array, other types of memory devices could be provided in accordance with the principles of the invention.

A left port of the dual port static random-access memory 26 is coupled to receive a combination of ten binary address signals. Seven binary address signals LA0–LA6 are provided to the left row decoder driver 30, and three binary address signals LA7–LA9 are provided to the left column decoder and input/output circuitry 34. Each respective combination of ten binary address signals LA0–LA9 provided to the left port of the dual port RAM memory array 28 corresponds to a respective location of the array 28. Eight-bit data words alternatively can be written into an addressed location of the array 28 or read out of an addressed location of the array 28 by the left row decoder 30, and left column decoder and input/output circuitry 34 on appropriate lines labelled L-I/O.

Similarly, seven binary address signals RA0-RA6 can be provided to the right row decoder driver 32, and three binary address signals RA7-RA9 can be provided to the right column decoder and input/output driver 36. Furthermore, each respective combination of ten binary address signals RA0-RA9 provided to a right port of the dual port RAM array 28 corresponds to a respective location of the array 28. An addressed location of the array 28 can be accessed for either writing of eight-bit data words into the location or reading eight-bit data words from the location via the right row decoder 32 and the right column decoder and input/output circuitry 36 on appropriate lines labelled R-I/O.

Each respective binary address signal LA0-LA6 provided to the left row decoder driver 30 and each respective binary address signal LA7-LA9 provided to the left column decoder and input/output circuitry 34 also is provided to the contention logic circuitry 38, and each respective binary address signal RA0-RA6 provided to the right row decoder driver 32 and each respective binary address signal RA7-RA9 provided to the right column decoder and input/output circuitry 36 also is provided to the contention logic circuitry 38. Furthermore, the contention logic circuitry 38 provides a number of status signals on respective lines 40-50 which are discussed below and receives on respective lines 54 and 56 respective signals which either enable or disable the respective left and right ports of the RAM array 28 as discussed more fully below.

In operation, the dual port static random-access memory 26 receives a first combination of binary address signals LA0-LA9 provided to its left port and receives a second combination of binary address signals RA0-RA9 provided to its right port. By simultaneously providing the first combination of address signals LA0-LA9 to the left port and the second combination of address signals RA0-RA9 to the right port, two different locations of the RAM array 28 simultaneously can be addressed. Thus, through the respective left and right column decoder and input/output circuits 34 and 36, binary data simultaneously either can be written into or read from two different addressed locations. Therefore, the dual port static random-access memory 26 simultaneously can provide access to its RAM array 28 by multiple microprocessors (not shown).

During such simultaneous access, the contention logic circuitry 38 monitors the respective combinations of binary address signals LA0-LA9 and RA0-RA9 in order to determine when the respective combinations correspond to a single location in the array 28. In the event that respective combinations of binary signals match and, therefore, do correspond to a single location of the array 28, the contention logic circuitry 38 detects the match, and determines which port should receive first access to the particular location and provides appropriate status signals as discussed below. In accordance with the present invention, however, the contention logic circuitry 38 substantially reduces the provision of status signals which unnecessarily limit access to an addressed memory location.

Figure 3:
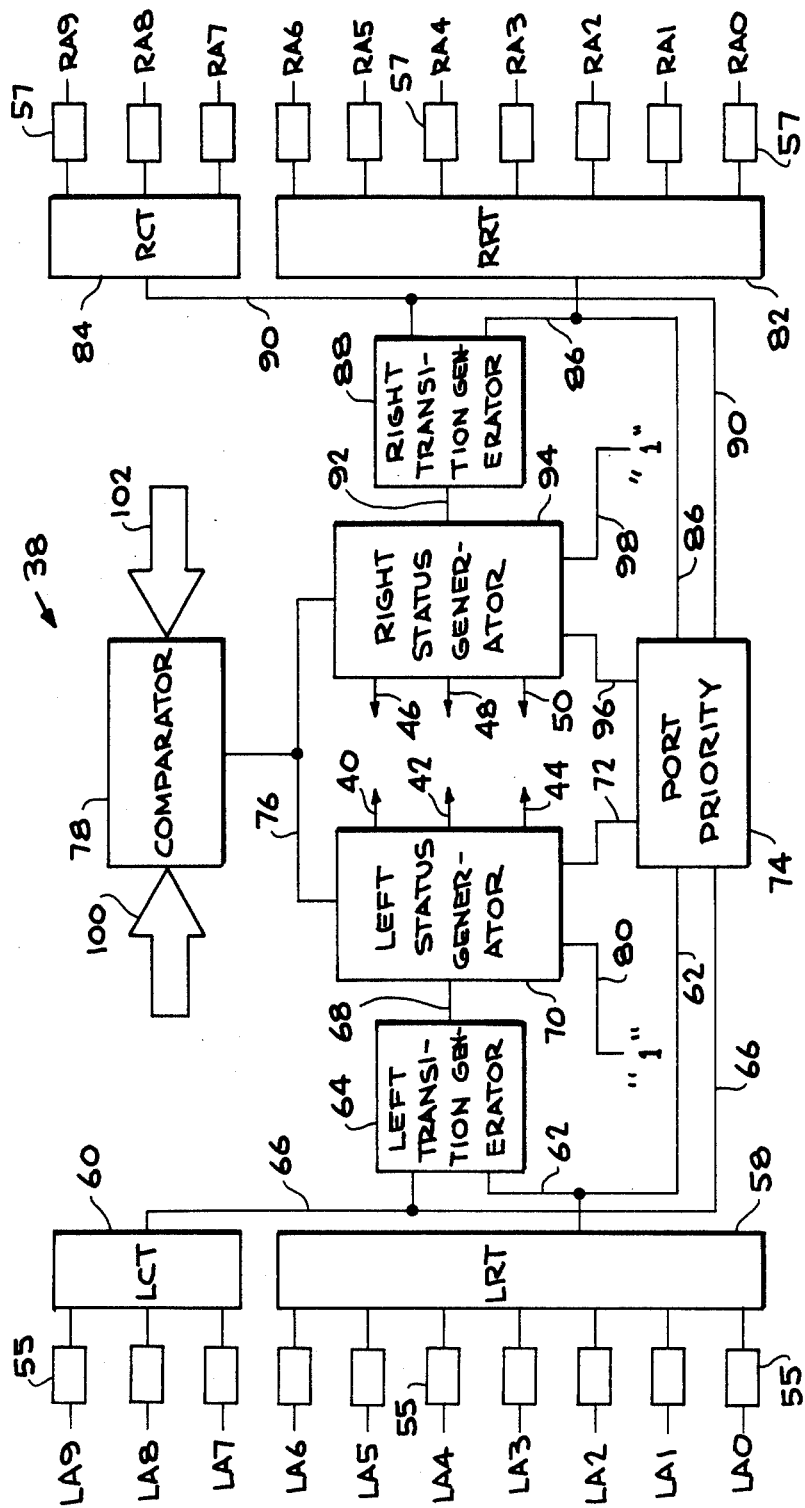
FIG. 3 shows a block diagram illustrating details of contention logic circuitry of the embodiment of FIG. 2.

Referring to the illustrative block diagram of FIG. 3, details are shown of the contention logic circuitry 38 of the integrated circuit device of the present invention. More particularly, the contention logic circuitry 38 is shown to include ten respective buffer circuits 55 each coupled to receive a respective left address signal LA0-LA9. The circuitry 38 further includes left row address signal transition detection circuitry (LRT) 58 and left column address signal transition detection circuitry (LCT) 60. The LRT 58 is coupled to receive seven buffered binary address signals LA0-LA6, and the LCT 60 is coupled to receive three buffered binary address signals LA7-LA9. The LRT 58 comprises circuitry which also can be used to provide bit line precharge signals and data line equalization signals. The LCT 60 comprises circuitry which also can be used to provide data line equalization signals. The LRT 58 is further coupled by branched line 62 to a left transition signal generator 64 and by branched line 62 to a port priority circuit 74. The LCT 60 also is further coupled by branched line 66 to the left transition signal generator 64 and by branched line 66 to the port priority circuit 74. The left transition signal generator 64, in turn, is coupled by line 68 to a left status signal generator 70. The left status signal generator 70 is coupled by line 72 to a port priority circuit 74, and is coupled by branched line 76 to a comparator circuit 78. The left status signal generator 70 also is coupled to a logical level 1 signal by line 80.

The contention logic circuitry 38 also includes ten respective buffer circuits 57 each coupled to receive a respective right address signal RA0-RA9. The circuitry 38 further includes right row address signal transition circuitry (RRT) 82 and right column address signal transition detection circuitry (RCT) 84. The RRT 82 is coupled to receive seven buffered binary address signals RA0-RA6, and the RCT is coupled to receive three buffered binary address signals RA7-RA9. The RRT 82 comprises circuitry which also can be used to provide bit line precharge signals and data line equalization signals. The RCT 84 comprises circuitry which also can be used to provide data line equalization signals. The RRT 82 is further coupled by branched line 86 to right transition signal generator 88 and by branched line 86 to the port priority circuit 74. The RCT 84 also is further coupled by branched line 90 to the right transition signal generator 88 and by branched line 90 to the port priority circuit 74. The right transition signal generator 88, in turn, is coupled by line 92 to a right status signal generator 94. The right status signal generator 94 is coupled by line 96 to the port priority circuit 74 and is coupled by branch line 76 to the comparator circuit 78. Also, the right status generator 94 is coupled by line 98 to a logical level 1 signal.

The comparator circuit 78 receives each of the binary address signals LA0-LA9 provided to the left port and receives each of the binary address signals RA0-RA9 provided to the right port. The respective large arrow labelled 100 represents the reception by the comparator circuit 78 of binary signals LA0-LA9, and the large arrow labelled 102 represents the reception by the comparator circuit 78 of binary signals RA0-RA9.

In operation, the LRT 58 detects substantially any change in a logical state of any one or more of the buffered signals LA0-LA6 provided to it, and in response to any such change in any one or more of those signals, it provides on line 62 a first left port address change pulse signal ($\phi$1L) in a logical level 1 state. Similarly, the LCT 60 detects substantially any change in a logical state of any one or more of the buffered signals LA7-LA9 provided to it, and in response to such a change, provides on line 66 a second left port address change pulse signal ($\phi$2L) in a logical level 1 state.

The respective first and second left port address change pulse signals, $\phi$1L and $\phi$2L, provided on lines 62 and 66 are received by the left transition signal generator 64. In response to a logical level 1 address change signal received on either line 62 or line 66 or both, the left transition signal generator 64 provides on lines 68 a logical level 1 first transition signal ($\phi$T1). The $\phi$T1 signal is provided on line 68 to the left status signal generator 70.

Similarly, the RRT 82 detects substantially any change in a logical state of any one or more of the buffered signals RA0-RA6 provided to it, and in response to any such change, provides on line 86 a first left port address change pulse signal ($\phi$1R) in a logical level 1 state as will be described more fully below. Similarly, the RCT 84 detects substantially any change in a logical state of any one or more of the three buffered address signals RA7-RA9 provided to it, and in response to such a change, provides on line 90 a second left port address change pulse signal ($\phi$2R) in a logical level 1 state.

The respective first and second right address change pulse signals, $\phi$1R and $\phi$2R, provided on lines 86 and 90, are received by the right transition signal generator 88. In response to a logical 1 state address change signal received on either line 86 or 90 or both, the right transition signal generator 88 provides on line 92 a logical level 1 second transition signal ($\phi$T2). The $\phi$T2 signal, in turn, is provided on line 92 to the right status signal generator 94.

The comparator 78, as indicated by large arrows 100 and 102, receives a combination of buffered signals substantially identical to those received by the left port of the RAM array 28 and to those received by the right port of the RAM array 28. The comparator circuit 78 continually monitors the combinations of binary address signals, LA0-LA9 and RA0-RA9, provided to the respective left and right ports of the RAM array 28 and generates on line 76 a logical state 0 address match signal ($\overline{AM}$) in response to a match in each respective signal of the combinations and a logical state 1 $\overline{AM}$ signal when there is no such match of respective signals. Thus, the address match signal $\overline{AM}$ on line 76 indicates when there is a match of combinations of binary address signals. It will be appreciated, of course, that such a match occurs when, for example, two microprocessors (not shown) simultaneously seek access to a single location of the RAM array 28.

As will be more fully explained below the port priority circuit 74 provides on lines 72 and 96 respective priority signals which determine whether the left status signal generator 70 will provide appropriate signals on lines 40-44 which substantially delay access to the left port of the RAM array 28 in response to a logical state 0 $\overline{AM}$ signal on line 76; or the right status signal generator 94 will provide on lines 46-50 status signals which substantially delay access to the right port of the RAM array 28 in response to a logical state 0 $\overline{AM}$ signal on line 76.

Figure 4:
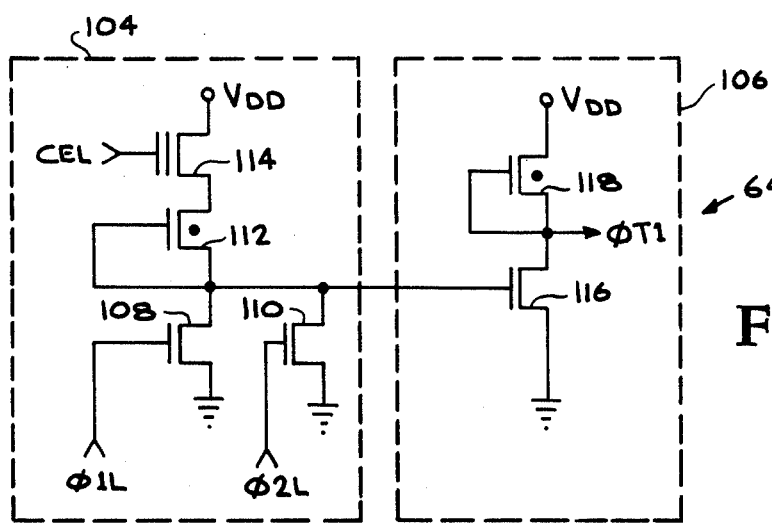
FIG. 4 illustrates a circuit diagram of a left transition signal generator of the contention logic circuitry of FIG. 3.

FIG. 4 is a circuit diagram showing details of the left transition signal generator 64 which comprises an OR logic gate including a NOR logic section shown within dashed lines 104 and an inverter logic section shown within dashed lines 106. The OR logic gate includes six transistor devices connected as shown. The NOR logic section includes two enhancement transistor devices 108 and 110, a depletion device 112 and a Z transistor device 114. The inverter logic section includes an enhancement transistor device 116 and a depletion transistor device 118. The respective enhancement devices 108, 110 and 116 are characterized by voltage thresholds of approximately 0.8 volts. The respective D devices 112 and 118 are characterized by voltage thresholds of approximately $-3.5$ volts. The respective Z device 114 is characterized by a voltage threshold of approximately 0 volts.

Signal CEL applied to a gate terminal of the Z transistor device 114 is in a logical level 1 state when the left port of the RAM array 28 is enabled. Pulse signals $\phi$1L and $\phi$2L represent the first and second left address change signals provided on respective lines 62 and 66 by the respective LRT 58 and LCT 60. Signal $\phi$T1 represents the first transition signal provided on line 68 in response to either a logical 1 state pulse signal $\phi$1L or $\phi$2L.

For reasons more fully discussed below, the OR logic gate of FIG. 4 is constructed such that a rising leading edge of a logical state 1 $\phi$T1 signal substantially coincides in time with a rising leading edge of either a logical 1 state $\phi$1L pulse signal or $\phi$2L pulse signal, whichever rises first, and such that a falling edge of the logical state 1 $\phi$T1 signal is delayed by approximately two nanoseconds after the falling edge of either the logical 1 state $\phi$1L pulse signal or $\phi$2L pulse signal, whichever falls last. One skilled in the art will appreciate that the timing of the provision of a $\phi$T1 signal relative to the $\phi$1L and $\phi$2L pulse signals can be varied by varying the current drive ratios of the NOR and inverter logic sections and by appropriately varying the capacitive loading of the NOR and inverter logic sections.

Figure 5:
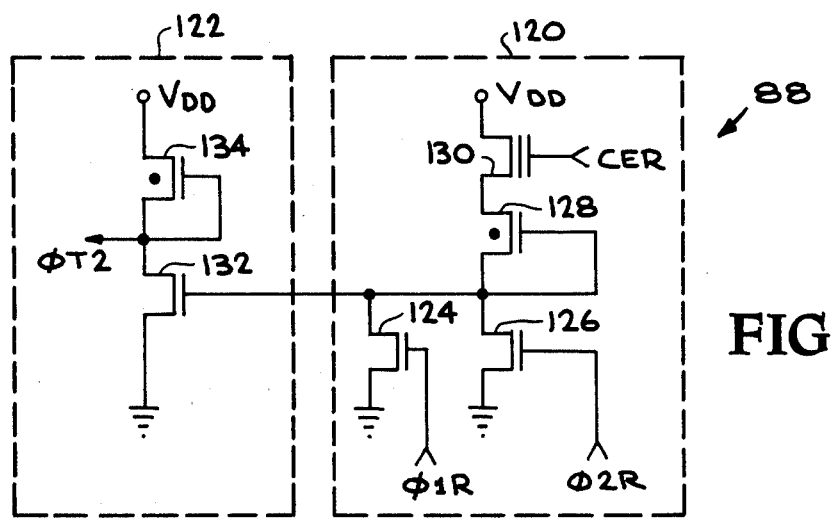
FIG. 5 illustrates a circuit diagram of a right transition signal generator of the contention logic circuitry of FIG 3.

Referring now to the drawings of FIG. 5, there is shown a circuit diagram illustrating details of the right transition signal generator 88 which comprises an OR logic gate including a NOR logic section shown within dashed lines 120 and an inverter logic section shown within dashed lines 122. The NOR logic section includes two enhancement transistor devices 124 and 126, a depletion device 128 and a Z transistor device 130 connected as shown. The inverter logic section includes an enhancement transistor device 132 and a depletion transistor device 134 connected as shown. The respective enhancement transistor devices 124, 126 and 132 are characterized by threshold voltages of approximately 0.8 volts. The D transistor devices 128 and 134 are characterized by voltage thresholds of approximately $-3.5$ volts. The Z transistor device 130 is characterized by a threshold voltage of approximately 0 volts.

Signal CER applied to a gate electrode of the Z transitor device 130 is in a logical level 1 state when the right port of the RAM array 28 is enabled. Signals $\phi$1R and $\phi$2R represent the first and second right address change signals provided on lines 86 and 90 by the respective RRT 82 and RCT 84. Signal $\phi$T2 represents the second transition signal provided on line 92 in response to either a logical 1 state signal $\phi$1R or $\phi$2R.

The OR logic gate illustrated in FIG. 5 is constructed such that a rising leading edge of a logical level 1 state $\phi$T2 signal substantially coincides in time with a rising leading edge of a first-to-occur pulse signal $\phi$1R or 2R, and such that a falling edge of a $\phi$T2 logical level 1 state signal lags a last-to-occur falling edge of a $\phi$1R or $\phi$2R pulse signal by approximately two nanoseconds. Those skilled in the art will appreciate that an OR logic gate like that illustrated in FIG. 5 can be constructed with the above-described timing characteristics by proper construction of current drive ratios of the NOR and inverter sections and by providing appropriate capacitive loading to the NOR and inverter sections.

Figure 6:
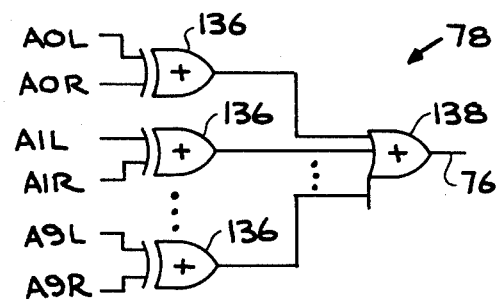
FIG. 6 illustrates a logic schematic diagram of a comparator circuit of the contention logic circuitry of FIG. 3.

Referring now to the illustrative drawing of FIG. 6, there is shown a logic schematic diagram illustrating the operation of the comparator circuit 78. The comparator circuit 78 comprises ten exclusive OR logic gates 136 and an OR logic gate 138 connected as shown. Each respective exclusive OR logic gate 136 receives a pair of corresponding binary address signals, one of which corresponds to an address signal applied to a left port of the RAM array 28 and another of which corresponds to an address signal provided to the right port of the RAM array 28. For example, signal A1L and signal A1R both are provided to one exclusive OR gate 136, and signal A9L and signal A9R both are provided to another exclusive OR gate 136. Address match signal $\overline{AM}$ provided on line 76 by the OR gate 138 takes a logical level 1 state unless there is a match in each of the corresponding pairs of binary address signals provided to the respective left and right ports of the RAM array 28. Thus, the OR logic gate 138 provides on line 76 address match signal $\overline{AM}$ in a logical 0 state only when the combination of binary address signals provided to the left and right ports each correspond to a single location of the memory array 28.

Figure 7:
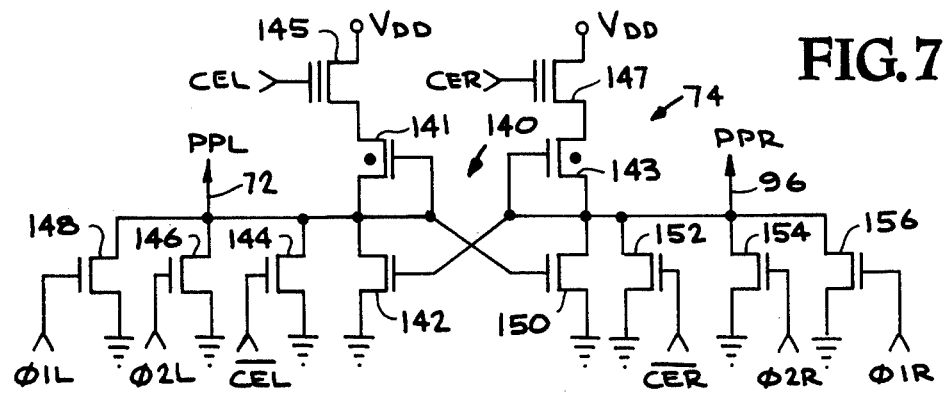
FIG. 7 illustrates a circuit diagram of a port priority circuit of the contention logic circuitry of FIG. 3.

The drawings of FIG. 7 show a circuit diagram of the port priority circuit 74. The port priority circuit 74 includes a latch section indicated generally by the numeral 140 which includes depletion transistor devices 141 and 143 and Z transistor devices 145 and 147 connected as shown. It also includes four left section pull-down enhancement transitors 142, 144, 146 and 148 connected as shown and four right section pull-down transitors labelled 150–156 connected as shown. As will be explained more fully below, the port priority circuit 74 provides port priority left (PPL) signals on line 72 and provides port priority right (PPR) signals on line 96.

The respective PPL and PPR signals determine which port of the RAM array 28 will receive first priority in the event that address signals provided to the respective left and right ports of the RAM array 28 simultaneously address a single memory location of the RAM array 28. For example, when the port priority circuit 74 is in a state wherein the PPL signal is in a logical level 1 state and the PPR is in a logical level 0 state, the left port will be provided first access to an address location of the array 28 in the event that a combination of binary address signals provided to the left and right ports of the array 28 simultaneously address a single location.

In operation, when signals $\phi$1L, $\phi$2L and $\overline{CEL}$ all are in logic 0 states, then signal PPL provided on line 72 generally remains in its latched state whether that be a logical level 1 or 0 state. It will be appreciated that when signals $\phi$1L, $\phi$2L and $\overline{CEL}$ all are in logic 0 states and a signal provided to a gate electrode of transistor 142 is in a logic 0 state, then signal PPL is in a logic 1 state, and if a signal provided to a gate electrode of transistor 142 is in a logical 1 state then signal PPL is in a logical 0 state. Similarly, when signals $\phi$1R, $\phi$2R, and $\overline{CER}$ all are in logical 0 state, then signal PPR generally remains in its latched state, whether that be a logical level 0 or 1 state. It will be appreciated that when signals $\phi$1R, $\phi$2R and $\overline{CEL}$ all are in logical 0 states and a signal provided to a gate electrode of transistor 150 is in a logical 0 state, then signal PPR is in a logical 1 state, and if a signal provided to the gate electrode of transistor 150 is in a logical 1 state then signal PPR is in a logical 0 state. However, when any one or more of signals $\phi$1L, $\phi$2L, $\overline{CEL}$ or the signal provided to the gate electrode of transitor 142 takes on a logical level 1 state, then signal PPL takes on a logical 0 state. Similarly, when any one or more of signals $\phi$1R, $\phi$2R, $\overline{CER}$ or a signal provided the gate electrode of transistor 150 transition takes on a logical level 1 state, then signal PPR takes on a logical level 0 state.

In the event that both signals PPL and PPR transition to logical level 0 states, then the latch circuit section 140 will set such that the priority signal, either PPL or PPR, whose pull-down transistors first return to a condition in which all signals provided to their respective gate electrodes are in a logical level 0 state will take on a logical 1 state, and the other priority signal will remain in a logical level 0 state. For example, if both signals PPL and PPR are in logical 0 states, and signals $\phi$1L, $\phi$2L, $\overline{CEL}$ and a signal provided to the gate electrode of transitor 142 all take on a logical level 0 state before signals $\phi$1R, $\phi$2R, $\overline{CER}$, and the signal provided to the gate electrode of transitor 150 all take on a logical 0 state, then signal PPL will take on a logical 1 state, and signal PPR will remain in a logical 0 state. Thus, the left port will have priority in addressing an address location when the combinations of address signals provided to the left and right ports match.

One will appreciate, of course, that, when one of the two ports is not enabled, the enabled port automatically receives first priority; since only its priority signal is in a logical 1 state. For example, if the right port is not enabled, then signal CER will be in a logical level 0 state, and signal $\overline{CER}$ provided to the gate electrode of transitor 152 will be in a logical 1 state causing signal PPR to be in a logical level 0 state. Thus, the left port will have priority over the right port.

Furthermore, one should appreciate that pulse signals $\phi$1L, $\phi$2L, $\phi$1R and $\phi$2R generally take on a logical 1 state only for a period of approximately seven to eight nanoseconds following a change in a corresponding combination of address signals. Consequently, a condition in which both signals PPL and PPR simultaneously are in a logical 0 state ordinarily will be relatively short-lived, and generally a port which first experienced a transition in a combination of address signals provided to it will achieve priority over the other port.

On very rare occasions a metastable condition may occur in which both signals PPL and PPR remain in approximately logical level 0 states although signal pulses $\phi$1L, $\phi$2L, $\phi$1R, $\phi$2R, $\overline{CER}$ and $\overline{CEL}$ all are in logical 0 states. A metastable condition is an example of a possible but atypical condition in the operation of the port priority circuit 74. It can momentarily result in a simultaneous assertion of active $\overline{BUSYL}$ and $\overline{BUSYR}$ signals which are discussed below. Thus, except for the metastable condition, $\overline{BUSYL}$ and $\overline{BUSYR}$ signals are not simultaneously in active states.

Figure 8:
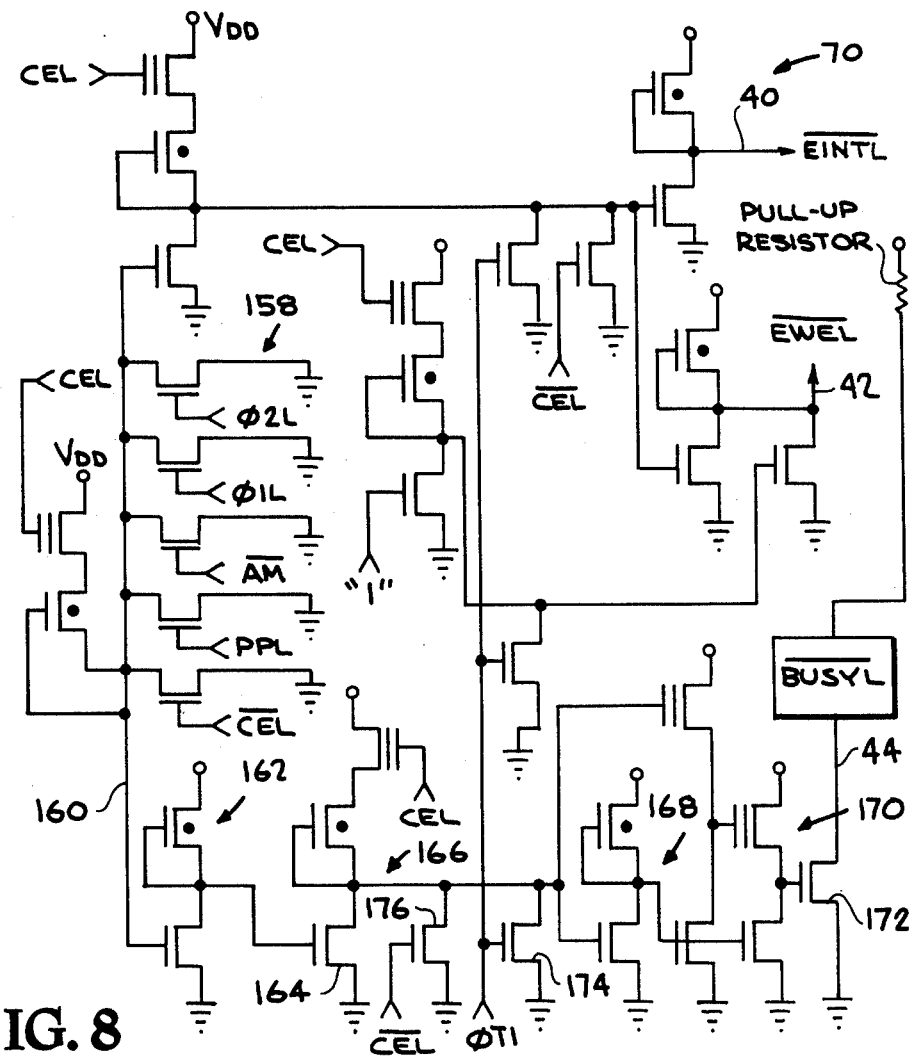
FIG. 8 illustrates a circuit diagram of a status signal generator of the contention logic circuitry of FIG. 3.

Referring now to the drawings of FIG. 8, there is shown a circuit diagram for the left status signal generator 70 which includes a plurality of transitor devices connected as shown. The left status signal generator 70 provides three respective status signals $\overline{EINTL}$, $\overline{EWEL}$ and $\overline{BUSYL}$, each of which are active low (logical level 0) state signals, on respective lines 40, 42 and 44. Signal $\overline{EINTL}$ is provided to an interrupt buffer (not shown). When signal $\overline{EINTL}$ is in a logical 1 state (a high state), interrupt flags cannot be set or reset by the left port, and when signal $\overline{EINTL}$ is in a logical 0 state (a low state) interrupt flags can be set or reset by the left port. Signal $\overline{EWEL}$ is provided to the left column decoder and input/output circuitry 34. When signal $\overline{EWEL}$ is in a logical 1 state, binary data cannot be written into the memory array 28 by the left port, and when signal $\overline{EWEL}$ is in a logical 0 state, binary data can be written into the memory array 28 by the left port. Finally, when signal $\overline{BUSYL}$ is in a logical 0 state, a microprocessor (which forms no part of the present invention and is not shown), coupled to line 44, for example, will have its access to the left port delayed. Conversely, when status signal $\overline{BUSYL}$ is in a logical 1 state, the microprocessor will not have its access to the left port delayed.

Figures 9, 10:
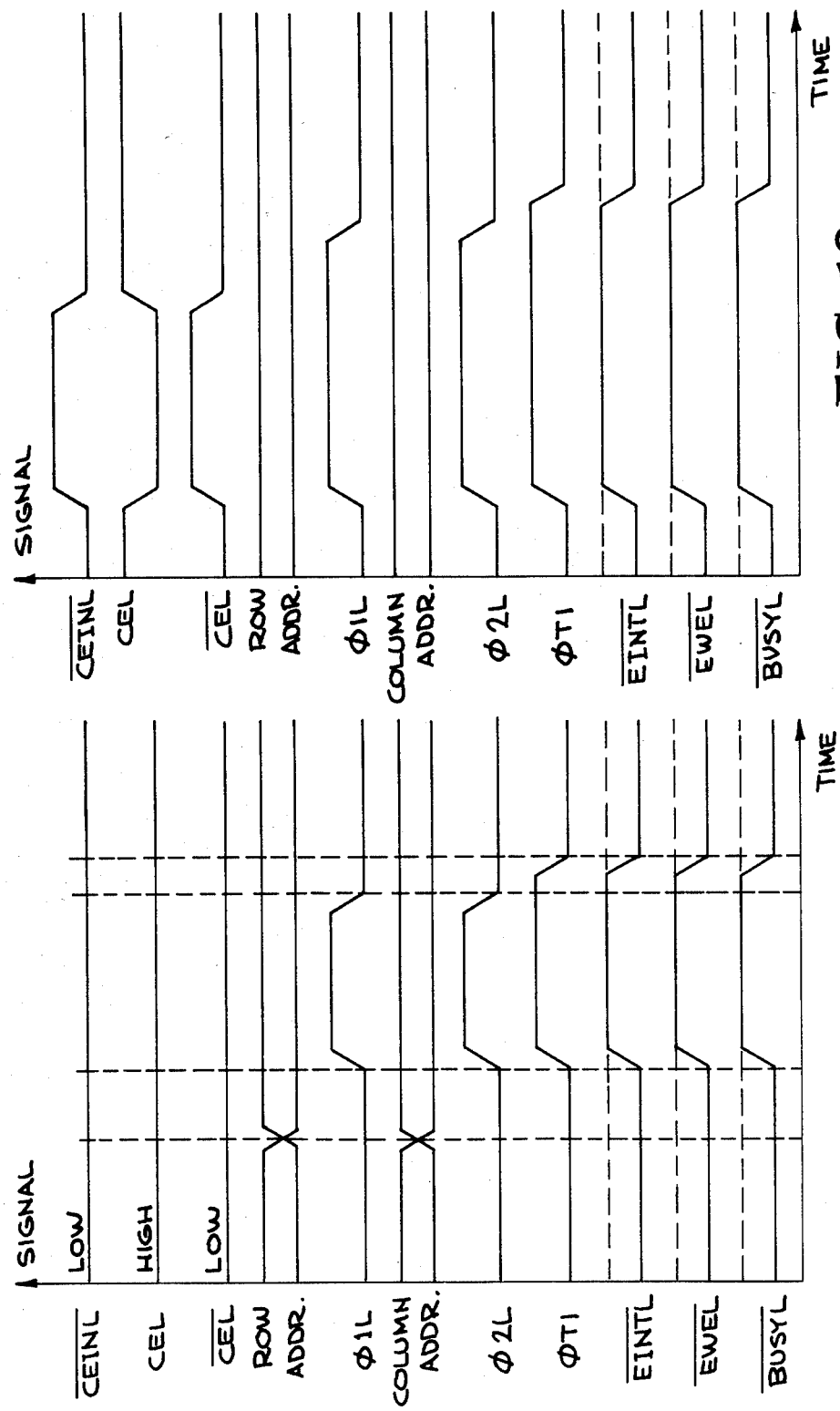
FIG. 9 illustrates an exemplary timing diagram for the embodiment of FIG. 2.
FIG. 10 illustrates another exemplary timing diagram for the embodiment of FIG. 2.

The operation of the left status signal generator 70 will be appreciated from the exemplary timing diagram of FIG. 9. In the timing diagram, signal $\overline{CEINL}$ is an externally generated active low signal which, as illustrated in FIG. 2, is provided to the contention logic circuitry 38 on line 54. A logical 0 state $\overline{CEINL}$ signal provided on line 54 enables the left port of the RAM array 28. Signals CEL and $\overline{CEL}$ are internally generated complementary signals generated in response to signal $\overline{CEINL}$. The logical state of signal CEL is the logical inverse of that of signal $\overline{CEINL}$.

From the drawing, it will be appreciated that during a provision of an active (low state) $\overline{CEINL}$ signal, a change in a combination of address signals provided to the LRT 58 results in the provision of a logical level 1 state $\phi 1L$ pulse signal. Ordinarily, there is a delay of approximately eight to ten nanoseconds between a change in a logical state of one or more address signals provided to the buffer circuits 55 which are coupled to the LRT 58 and a provision of a logical level 1 state $\phi 1L$ pulse signal on line 62. Similarly, a change in a combination of address signals provided to the buffer circuits 55 coupled to the LCT 60 results in a provision of a logical level 1 state $\phi 2L$ pulse signal on branched line 66 after a delay of approximately eight to ten nanoseconds. Substantially simultaneously with the appearance of either a logical level 1 state $\phi 1L$ or $\phi 2L$ signal, a logical level 1 state $\phi T1$ signal is provided. The logical state 1 $\phi T1$ signal remains in a logical level 1 state substantially throughout a period of time during which either or both the $\phi 1L$ or $\phi 2L$ pulse signals are in logical level 1 states, and for approximately two nanoseconds after both the $\phi 1L$ and $\phi 2L$ pulse signals have transitioned back to logical level 0 states.

Status signals $\overline{EINTL}$, $\overline{EWEL}$ and $\overline{BUSYL}$ all take logical level 1 states substantially during an entire period of time during which signal $\phi T1$ is in a logical level 1 state. The dashed lines shown in FIG. 9 associated with the three respective status signals indicate that outside a period of time when signal $\phi T1$ is in a logical level 1 state, the logical states of the three status signals can be either logical 1 or logical 0.

Referring now to the illustrative timing diagram of FIG. 10, operation of the left status signal generator 70 is shown during a representative period of time when a logical level 1 (inactive) state signal $\overline{CEINL}$ is provided on line 54 to the contention logic circuitry 38 shown in FIG. 2. It will be appreciated that when signal $\overline{CEINL}$ is in the logical level 1 (inactive) state, the left port is not enabled, and therefore, address locations of the RAM array 28 cannot be accessed via the left port.

During the period of time when the left port is not enabled, precharge signals are provided to bit lines of the RAM array 28 in order to prevent access time delays in a next access. Since, in the preferred embodiment, signals $\phi 1L$ and $\phi 2L$ are derived from such precharge signals and from such data line equalization signals, pulse signals $\phi 1L$ and $\phi 2L$ are in logical level 1 states during the time when $\overline{CEINL}$ is in a logical 1 state. Consequently, signal $\phi T1$ also takes on a logical level 1 state when signal $\overline{CEINL}$ is in a logical level 1 state.

Pulse signals $\phi 1L$ and $\phi 2L$ remain in the logical 1 state substantially until signal $\overline{CEINL}$ transitions to a logical level 0 state, and the left port once again is enabled. Of course, the $\phi T1$ signal transitions back to the logical level 0 state approximately two nanoseconds after the $\phi 1L$ and $\phi 2L$ signals both have transitioned back to the logical level 0 state. Furthermore, during the period when signal $\phi T1$ is in a logical level 1 state, the three status signals $\overline{EINTL}$, $\overline{EWEL}$ and $\overline{BUSYL}$ all are in logical level 1 states.

Referring once again to the circuit diagram of FIG. 8, the following functional description of the operation of the left status signal generator 70 will serve to further explain the advantages achieved by the present invention. A logical level 0 state (active) $\overline{BUSYL}$ status signal is provided when four conditions are satisfied: both ports are enabled; there is a match in a combination of address signals provided to respective left and right ports of the RAM array 28; the left port does not have priority; and signal $\phi T1$ is in a logical level 0 state.

Thus, for example, referring to a NOR gate indicated generally by the reference numeral 158, a logical level 1 state signal will be provided on line 160 by the NOR gate 158 when the left port is enabled ($\overline{CEL}$ is in logical 0 state); and the left port does not have priority (signal PPL is in a logical 0 state); there is an address match (signal $\overline{AM}$ is in logical 0 state); and the combination of address signals provided to the right port have settled and are steady (pulse signals $\phi 1R$ and $\phi 2R$ are in logical level 0 states). The provision of a logical level 1 state signal on line 160 to inverter circuit 162 results in the provision of a logical level 0 signal to a gate electrode of transitor 164 of a NOR gate indicated by reference numeral 166. When a logical level 0 state signal is provided to the gate electrode of transitor 164 and signals $\overline{CEL}$ and $\phi T1$ are in logical 0 states, a logical 1 state signal is provided to inverter circuit 168. Consequently, inverter circuit 170 causes a provision of a logical 1 state signal to a gate electrode of transitor 172, and as a result, a logical level 0 state (active) $\overline{BUSYL}$ status signal is provided.

Signal $\phi T1$ when provided in a logical level 1 state by the left transition signal generator 64 to a gate electrode of transitor 174, pulls down the logical level of the signal provided to inverter circuit 168, and ultimately results in a logical level 1 (inactive) state $\overline{BUSYL}$ status signal being provided on line 44. Furthermore, disabling of the left port, which results in a provision of a logical level 1 state $\overline{CEL}$ signal to a gate electrode of transitor 176, similarly results in a provision of a logical level 1 state (inactive) $\overline{BUSYL}$ status signal.

Thus, signals provided to the NOR logic gate 158 can cause a logical level 0 (active) state $\overline{BUSYL}$ status signal in response to a match in combinations of address signals provided to a respective left and right ports. However, during a period of time, illustrated in FIG. 9, when a logical level state $\phi T1$ signal is provided in response to a change in a combination of address signals provided to either the LRT 58 or the LCT 60, the $\overline{BUSYL}$ status signal is held in a logical level 1 (inactive) state.

Therefore, the left status signal generator 70 delays a provision of a logical level 0 state (active) $\overline{BUSYL}$ status signal in response to an address match until after a disappearance of the logical level state ϕT1 signal. During such a delay period, however, conditions which erroneously indicate an address match may disappear, in which case no logical level 0 (active) state BUSYL signal will follow the period of delay. The result is to substantially prevent the provision of a logical level 0 (active) state BUSYL status signals due to very brief temporary matches in combinations of address signals provided to the left and right ports and to near matches. Thus, the dual port static-random access memory 26 of the present invention is less likely to provide unnecessary active BUSYL status signals as a result of address signal skew or near matches in combinations of address signals provided to its respective left and right ports.

Furthermore, the provision of a ϕT1 signal which remains in a logical level 1 state for a period of time approximately two nanoseconds after the later falling edge of logical level 1 state ϕ1L and ϕ2L signals, substantially ensures that the latch circuit section 140 of the port priority circuit 74 has latched, and signal PPL has stabilized before signal ϕT1 transitions back to a logical level 0 state after an address transition, and the BUSYL status signal once again becomes responsive to a signal provided on line 160 by NOR logic gate 158. It will be appreciated, of course, that when the BUSYL status signal is responsive to a signal provided on line 160, the BUSYL status signal is substantially responsive to the address match signal AM and to the PPL signal and to the ϕ1R and ϕ2R pulse signals. The provision of ϕ1R and ϕ2R pulse signals to the port priority circuity 74 in the manner described speeds the provision of an inactive (logical level 0) state BUSYL signal in response to an address signal change at the right port. Since a change in a combination of address signals provided to the right port generally will mean that address signal combinations provided to the left and right ports will not match after such a right port address signal change.

One will appreciate that the construction and operation of the right status signal generator 94 is analogous to that of the left 70, and therefore, need not be described in detail herein.

Thus, the present invention and associated method advantageously permits the operation of multiple port integrated circuit memory array devices which better tolerate near matches in combinations of address signals provided to different ports and very brief matches in such signal combinations due to problems such as address signal skew, without causing status signals which unnecessarily delay access to the memory array of such devices. More particularly, the provision of respective ϕT1 and ϕT2 signals in response to changes in respective binary address signal combinations is used to substantially delay for a prescribed period of time an evaluation by such a device of whether address signal combinations match.

In the preferred embodiment, the prescribed period of time for the left port is when signal ϕT1 is in a logical level 1 state, and for the right port, it is when signal ϕT2 is in a logical level 1 state. During those periods of time, the effects of very near matches and of problems such as address signal skew presumably will dissipate, and, therefore, will not result in a provision of a status signal which unnecessarily delays access to the memory array.

It will be understood that the above-described embodiments are merely illustrative of many possible specific embodiments which can represent the principles of the invention. Numerous and varied other arrangements can readily be devised in accordance with these principles without departing from the spirit and scope of the invention. For example, the preferred embodiment described herein provides active low (logical level 0) state status signals. The invention, however, can be practiced by providing active high (logical level 1) state signals as well. Furthermore, the invention can be implemented using CMOS, GaAs or bipolar technology, for example. Thus, the foregoing description is not intended to limit the invention which is defined in the appended claims in which:

What is claimed is:

1. An Integrated circuit device including a memory array comprising a plurality of respective memory locations for storing binary data, each respective memory location corresponding to a respective combination of binary address signals, said device further comprising:
   at least two respective port means for receiving respective combinations of binary address signals corresponding to respective locations of said memory array;
   transition detection and signal providing means for detecting a change in a respective combination of binary address signals received by either a first or a second of said at least two port means, and for providing a first transition signal in response to a change in a respective first combination of address signals received by said first port means and for providing a second transition signal in response to a change in a respective second combination of address signals received by said second port means; and
   address match means for receiving said first and second combinations of binary address signals and for providing a match signal in response to a match in said first and second combinations; and
   status signal providing means for receiving said first and second transition signals and said match signal and for providing a first status signal in an inactive state during a first period of time in response to a provision of said first transition signal whether or not a match signal is received substantially during said first period of time, and for providing a second status signal in an inactive state during a second period of time in response to a provision of said second transition signal whether or not a match signal is received substantially during said second period of time, and for substantially providing either only said first status signal or only said second status signal in an active state in response to a match signal substantially after said first and said second periods of time.

2. The device of claim 1 wherein said address match means comprises comparator means.

3. The device of claim 1, further comprising:
   priority means for providing a priority signal to said status signal providing means which causes said status signal providing means to substantially provide either only said respective first or only said respective second status signal in an active state in response to said match signal substantially after said first and second periods of time.

4. The device of claim 1 wherein:
   substantially during said first period of time said first combination of address signals can substantially settle to a new first combination of signals; and substantially during said second period of time said second combination of address signals can substantially settle to a new second combination of signals.

5. The device of claim 4 wherein said transition detection and signal providing means can provide said first transition signal substantially throughout said first period of time and can provide said second transition signal substantially throughout said second period of time.

6. The device of claim 1 wherein said transition detection and signal providing means comprises:
means for providing a first signal pulse in response to at least one change in the respective first combination of address signals;
means for receiving said first signal pulse and for providing said first transition signal substantially throughout said first time period, wherein said first time period expires after said first signal pulse ends;
means for providing a second signal pulse in response to at least one change in the respective second combination of address signals; and
means for receiving said second signal pulse and for providing said second transition signal substantially throughout said second time period, wherein said second time period expires after said first signal pulse ends.

7. An integrated circuit device including a memory array comprising a plurality of respective memory locations for storing binary data, each respective memory location corresponding to a respective combination of binary address signals, said device further comprising:
at least two respective port means for receiving respective combinations of binary address signals corresponding to respective locations of said memory array;
transition detection and signal providing means including,
means for providing a first signal pulse in response to at least one change in the respective first combination of address signals,
means for receiving said first signal pulse and for providing a first transition signal substantially throughout a first time period, wherein said first time period expires after said first signal pulse ends,
means for providing a second signal pulse in response to at least one change in the respective second combination of address signals,
means for receiving said second signal pulse and for providing a second transition signal substantially throughout a second time period wherein said second time period expires after said second signal pulse ends;
address match means for receiving said first and second combinations of binary address signals and for providing a match signal in response to a match in said first and second combinations;
status signal providing means for receiving said first and second transition signals and said match signal and for providing a first status signal in an inactive state during said first period of time in response to a provision of said first transition signal whether or not a match signal is received substantially during said first period of time, and for providing a second status signal in an inactive state during said second period of time in response to a provision of said second transition signal whether or not a match signal is received substantially during said second period of time, and for substantially providing either only said first status signal or only said second status signal in an active state in response to a match signal substantially after said first and said second periods of time; and
priority means for receiving said first and second signal pulses and for providing a priority signal to said status signal providing means, said priority signal determining whether only said respective first or only said respective second status signal is provided in an active state in response to said match signal substantially after said first and said second periods of time.

8. A method for controlling access to respective ports of a multiple port integrated circuit memory array including a plurality of respective memory locations, each memory location corresponding to a respective combination of binary address signals, comprising the following steps:
receiving a first combination of binary address signals and a second combination of binary address signals;
detecting a change in said first combination;
detecting a change in said second combination;
providing a first transition signal in response to a change in said first combination;
providing a second transition signal in response to a change in said second combination;
determining whether there is a match in said first and second combinations of binary address signals and providing a match signal in response to a match;
substantially during a first period of time, providing a first status signal in an inactive state in response to said first transition signal;
substantially during a second period of time, providing a second status signal in an inactive state in response to said second transition signal; and
in response to said match signal and substantially after said respective first and second periods of time, providing either only said first status signal or only said second status signal in an active state.

9. The method of claim 8 wherein:
during said first period of time said first combination of address signals can substantially settle to a new first combination of signals; and
during said second period of time said second combination of address signals can substantially settle to a new second combination of signals.

10. The method of claim 9 wherein:
said step of providing a first transition signal provides said first transition signal substantially throughout said first time period; and
said step of providing a second transition signal provides said second transition signal substantially throughout said second time period.

* * * * *